(12) United States Patent
Han et al.

(10) Patent No.: US 7,737,468 B2
(45) Date of Patent: Jun. 15, 2010

(54) SEMICONDUCTOR DEVICES HAVING RECESSES FILLED WITH SEMICONDUCTOR MATERIALS

(75) Inventors: Jin-Ping Han, Fishkill, NY (US); Henry Utomo, Newburgh, NY (US); O Sung Kwon, Wappingers Falls, NY (US); Oh Jung Kwon, Hopewell Junction, NY (US); Judson Robert Holt, Wappingers Falls, NY (US); Thomas N. Adam, Poughkeepsie, NY (US)

(73) Assignees: Infineon Technologies AG, Neubiberg (DE); International Business Machines Corporation, Armonk, NY (US)

( * ) Notice: Subject to any disclaimer, the term of this patent is extended or adjusted under 35 U.S.C. 154(b) by 356 days.

(21) Appl. No.: 11/804,773

(22) Filed: May 21, 2007

(65) Prior Publication Data
US 2008/0290370 A1 Nov. 27, 2008

(51) Int. Cl.
*H01L 29/778* (2006.01)
*H01L 21/20* (2006.01)

(52) U.S. Cl. .......... 257/192; 257/E21.09; 257/E21.409; 257/E29.246; 438/300; 438/504

(58) Field of Classification Search .................. 257/192, 257/183, E21.09, E21.409, E29.246; 438/300, 438/504
See application file for complete search history.

(56) References Cited

U.S. PATENT DOCUMENTS

| 7,554,110 | B2 * | 6/2009 | Yu et al. .................... 257/18 |
| 2005/0285187 | A1 * | 12/2005 | Bryant et al. .............. 257/335 |
| 2006/0145273 | A1 * | 7/2006 | Curello et al. ............. 257/410 |
| 2007/0202641 | A1 * | 8/2007 | Wei et al. ................... 438/194 |
| 2008/0203427 | A1 * | 8/2008 | Mowry et al. .............. 257/190 |

* cited by examiner

*Primary Examiner*—Matthew Smith
*Assistant Examiner*—Walter H Swanson
(74) *Attorney, Agent, or Firm*—Slater & Matsil, L.L.P.

(57) ABSTRACT

Semiconductor devices and methods of manufacturing thereof are disclosed. In a preferred embodiment, a method of manufacturing a semiconductor device includes providing a workpiece, and forming a recess in the workpiece. The recess has a depth having a first dimension. A first semiconductive material is formed in the recess to partially fill the recess in a central region to a height having a second dimension. The second dimension is about one-half or greater of the first dimension. A second semiconductive material is formed over the first semiconductive material in the recess to completely fill the recess, the second semiconductive material being different than the first semiconductive material.

9 Claims, 4 Drawing Sheets

SEMICONDUCTOR DEVICES HAVING RECESSES FILLED WITH SEMICONDUCTOR MATERIALS

TECHNICAL FIELD

The present invention relates generally to the fabrication of semiconductor devices, and more particularly to the fabrication of transistors.

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various layers using lithography to form circuit components and elements thereon.

A transistor is an element that is utilized extensively in semiconductor devices. There may be millions of transistors on a single integrated circuit (IC), for example. A common type of transistor used in semiconductor device fabrication is a metal oxide semiconductor field effect transistor (MOSFET). A transistor typically includes a gate dielectric disposed over a channel region, and a gate formed over the gate dielectric. A source region and a drain region are formed on either side of the channel region within a substrate or workpiece.

In some transistor designs, it is desirable to introduce stress to the channel region to enhance carrier mobility.

What are needed in the art are improved methods and structures for introducing stress in transistors and other semiconductor devices.

SUMMARY OF THE INVENTION

These and other problems are generally solved or circumvented, and technical advantages are generally achieved, by preferred embodiments of the present invention, which provide novel methods and structures for introducing stress to the channel regions of transistors.

In accordance with a preferred embodiment of the present invention, a method of manufacturing a semiconductor device includes providing a workpiece, and forming a recess in the workpiece. The recess has a depth having a first dimension. A first semiconductive material is formed in the recess to partially fill the recess in a central region to a height having a second dimension. The second dimension is about one-half or greater of the first dimension. A second semiconductive material is formed over the first semiconductive material in the recess to completely fill the recess, the second semiconductive material being different than the first semiconductive material.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in specific contexts, namely implemented in single transistor devices and CMOS two-transistor device applications. Embodiments of the invention may also be implemented in other semiconductor applications such as memory devices and other applications. Embodiments of the invention may also be implemented in other semiconductor applications where introducing stress to an adjacent region is desired, for example.

In some transistor applications, it is desirable to introduce stress in the channel region of the transistor, in order to increase the mobility of semiconductor carriers such as electrons and holes. One method used to induce strain is embedded SiGe (eSiGe), which involves creating a recess in the source and drain regions of a MOS transistor, and growing a doped SiGe film within the recess in lieu of conventional silicon source and drain regions. The larger crystal lattice of the eSiGe creates a stress in the channel between the source and drain and thereby enhances the carrier mobility. However, it is difficult to form silicide on SiGe, resulting in a high sheet resistance ($R_S$) in the source and drain regions, particularly when higher percentages of Ge are used in the eSiGe, for example.

Embodiments of the present invention achieve technical advantages by selectively forming Si on top of eSiGe in source and drain regions of transistors, leaving eSiGe residing near the channel region and also near isolation regions in some embodiments. The Si improves the formation of a subsequently-formed silicide, while the eSiGe proximate the channel region and optionally also the isolation regions improves device performance by altering the stress.

FIGS. 1 through 4 show cross-sectional views of a semiconductor device 100 at various stages of manufacturing in accordance with a preferred embodiment of the present invention. To manufacture the device 100, first, a workpiece 102 is provided. The workpiece 102 may include a semiconductor substrate comprising silicon or other semiconductor materials and may be covered by an insulating layer, for example. The workpiece 102 may also include other active components or circuits, not shown. The workpiece 102 may comprise silicon oxide over single-crystal silicon, for example. The workpiece 102 may include other conductive layers or other semiconductor elements, e.g., transistors, diodes, etc. Compound semiconductors, GaAs, InP, Si/Ge, or SiC, as examples, may be used in place of silicon. The workpiece 102 may comprise a silicon-on-insulator (SOI) or a germanium-on-insulator (GOI) substrate, as examples.

Isolation regions 104 are formed in the workpiece 102. The isolation regions 104 may comprise shallow trench isolation (STI) regions, deep trench (DT) isolation regions, field oxide isolation regions, or other insulating regions, as examples. The isolation regions 104 may be formed by depositing a hard mask (not shown) over the workpiece 102 and forming trenches in the workpiece 102 and hard mask using a lithography process. For example, the isolation regions 104 may be formed by depositing a photoresist, patterning the photoresist using a lithography mask and an exposure process, developing the photoresist, removing portions of the photoresist, and then using the photoresist and/or hard mask to protect portions of the workpiece 102 while other portions are etched away, forming trenches in the workpiece 102. The photoresist is then removed, and the trenches are then filled with an insulating material such as an oxide or nitride, or combinations thereof, as examples. The hard mask may then be removed. Alternatively, the isolation regions 104 may be formed using other methods.

A gate dielectric material 106 is deposited over the workpiece 102 and the isolation regions 104. The gate dielectric material 106 preferably comprises about 200 Angstroms or less of an oxide such as $SiO_2$, a nitride such as $Si_3N_4$, a high-k dielectric material having a dielectric constant greater than 3.9, such as $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, or combinations and multiple layers thereof, as examples. Alternatively, the gate dielectric material 106 may comprise other dimensions and materials, for example. The gate dielectric material 106 may be formed using chemical vapor deposition (CVD), atomic layer deposition (ALD), metal organic chemical vapor deposition (MOCVD), physical vapor deposition (PVD), or jet vapor deposition (JVD), as examples, although alternatively, other methods may also be used.

A gate material 108 is deposited over the gate dielectric material 106. The gate material 108 preferably comprises an electrode material. The gate material 108 preferably comprises a thickness of about 1,500 Angstroms or less, for example. The gate material 108 preferably comprises a semiconductor material, such as polysilicon or amorphous silicon; a metal such as TiN, HfN, TaN, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, TaC, TaCN, TaCNO, or other metals; a partially or fully silicided gate material (FUSI), having a silicide layer comprised of titanium silicide, nickel silicide, tantalum silicide, cobalt silicide, or platinum silicide; and/or combinations or multiple layers thereof, as examples. The gate material 108 may comprise a variety of different stoichiometry combinations for the components of the exemplary metals listed, for example. Alternatively, the gate material 108 may comprise other dimensions and materials, for example. The gate material 108 may be formed by CVD, PVD, or other suitable deposition methods, for example. The gate material 108 may optionally be implanted with dopants; e.g., the gate material 108 may be predoped or may be doped later, at the same time source and drain regions are implanted with dopants.

A hard mask 110 is deposited over the gate material 108. The hard mask 110 may comprise a nitride material such as silicon nitride, an oxide material such as silicon dioxide, a nitridized oxide, or multiple layers and combinations thereof, for example, although alternatively, the hard mask 110 may comprise other materials. The hard mask 110 will prevent the formation of a first semiconductive material (see 116 in FIG. 3) over the gate material 108 in a later processing step, for example. The hard mask 110 preferably comprises about 500 Angstroms or less of silicon nitride, although alternatively, the hard mask 110 may comprise other dimensions and materials.

Figure 1:
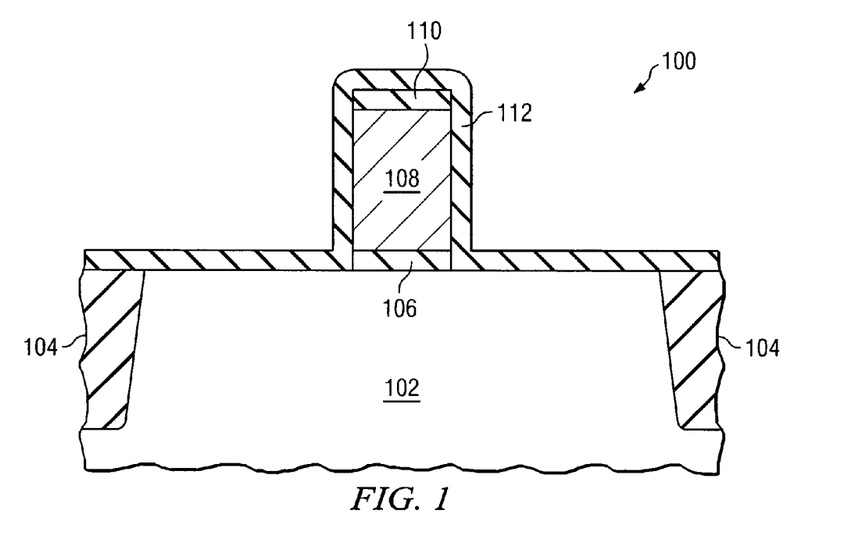
FIGS. 1 through 4 show cross-sectional views of a semiconductor device at various stages of manufacturing in accordance with a preferred embodiment of the present invention, wherein recessed source and drain regions of a transistor are partially filled with a first semiconductive material and the remainder of the recesses are filled with a second semiconductive material, after the formation of first sidewall spacers.

The hard mask 110, the gate material 108, and the gate dielectric material 106 are patterned using lithography to form a gate 106 and gate dielectric 104 with a patterned hard mask 110 residing on top, as shown in FIG. 1. The workpiece 102 may be lightly doped with a dopant species to form lightly doped regions (not shown) in a top surface of the workpiece 102 proximate the gate 108 and gate dielectric 106, after the patterning of the gate 106 and the gate dielectric 104. Other implantation processes (e.g., pocket implants, halo implants, or double-diffused regions) may also be performed as desired after the patterning of the gate 106 and gate dielectric 104, for example.

Figure 2:
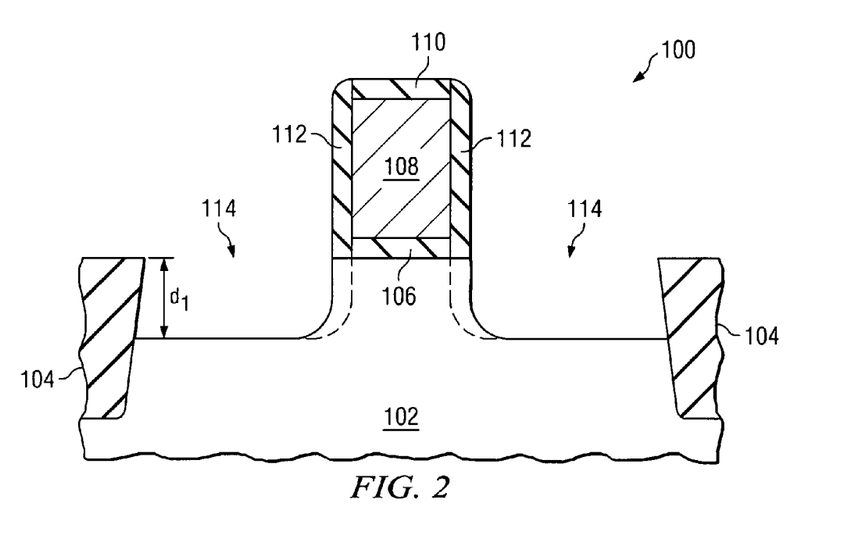

A sidewall spacer material 112 is formed over the top surface of the hard mask 110, the workpiece 102, and the isolation regions 104, and over the sidewalls of the gate 108, gate dielectric 106, and hard mask 110, as shown in FIG. 1. The sidewall spacer material 112 may comprise one or more liners and may comprise two or more layers of insulating material, e.g., such as silicon nitride, silicon oxide, and/or silicon oxynitride, although other materials may also be used. The sidewall spacer material 112 is preferably conformal as deposited and is preferably etched using an anisotropic or directional etch process. The anisotropic etch process removes the sidewall spacer material 112 from the top surfaces of the hard mask 110, the workpiece 102, and the isolation regions 104, leaving sidewall spacers 112 on the sidewalls of the hard mask 110, gate 108, and gate dielectric 106, as shown in FIG. 2. The sidewall spacers 112 may comprise downwardly-sloping sidewalls as shown due to the anisotropic etch process, for example.

After the formation of the sidewall spacers 112, which are also referred to herein as first sidewall spacers 112, optionally, the workpiece 102 may be implanted with a deep implantation of a dopant species proximate the first sidewall spacers 112, not shown. The first sidewall spacers 112 may comprise temporary spacers that are later removed and replaced with permanent sidewall spacers that remain in the structure in some embodiments, for example, not shown.

Exposed portions of the workpiece 102 are then recessed using an etch process, e.g., using an etch process adapted to remove the workpiece 102 material and not the isolation region 104 material, hard mask 110, or sidewall spacers 112, forming recesses 114 in the workpiece 102 proximate a first side and a second side of the gate 108 and gate dielectric 106, as shown in FIG. 2. The recesses 114 preferably comprise a depth beneath the top surface of the workpiece 102 comprising a dimension $d_1$ of about 200 nm or less, for example. The recesses 114 preferably comprise a width of about 900 nm to 1 μm (shown as dimension $d_5$ in FIG. 6) or less in some embodiments, as another example. Alternatively, the recesses 114 may comprise other dimensions. The recesses 114 may comprise substantially oval, round, square, rectangular, triangular, or trapezoidal shapes, as examples, although alternatively, the recesses 114 may comprise other shapes.

The recesses 114 comprise two holes in the top surface of the workpiece 102 formed on either side of the gate 108 and gate dielectric 106. The etch process to form the recesses 114 may be substantially anisotropic, etching material preferentially in a downward direction, as shown. Alternatively, the etch process to form the recesses 114 may be isotropic, slightly undercutting the workpiece 102 beneath the sidewalls spacers 112, as shown in phantom in FIG. 2. The etch process to form the recesses 114 may alternatively be partially anisotropic and partially isotropic, as another example. The etch process to form the recesses 114 may comprise a reactive ion etch (RIE) process, or a dry or wet etch process, as examples. Only two recesses 114 are shown in FIGS. 1 through 6; however, alternatively, preferably a plurality of recesses 114 are simultaneously formed (e.g., a plurality of transistors are preferably formed at once across the workpiece 102).

Figure 3:
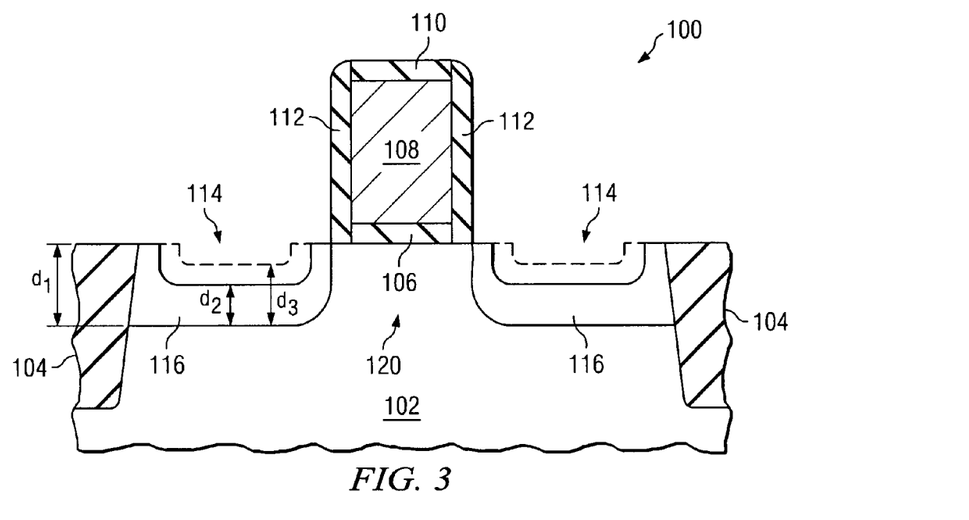

Next, in accordance with an embodiment of the present invention, the recesses 114 are partially filled with a first semiconductive material 116 in a lower portion of the recesses 114, as shown in FIG. 3. The first semiconductive material 116 is also formed or disposed in an upper portion of the recesses 114 at least adjacent to the channel region 120. The first semiconductive material 116 preferably comprises a compound semiconductor comprising silicon (Si) and at least one other element, for example. The other element(s) preferably comprises an atom having a different size than Si and/or a different atom size than the material of the workpiece 102, so that stress is created in the first semiconductive material 116 which is bounded on both sides by the workpiece 102, for example. The first semiconductive material 116 preferably comprises a material adapted to alter a stress of the workpiece 102 in a region of the workpiece 102 proximate the first semiconductive material 116.

For example, the first semiconductive material 116 is preferably adapted to alter the stress of the adjacent channel region 120. The first semiconductive material 116 preferably comprises SiGe, carbon-doped SiGe, or SiC, to be described further herein, although alternatively, the first semiconductive material 116 may also comprise other materials. A first semiconductive material 116 comprising SiGe or carbon-doped SiGe introduces or increases tensile stress of the source region and the drain region, which creates compressive stress on the channel region 120. A first semiconductive material 116 comprising SiC introduces or increases compressive stress of the source region and the drain region, which creates tensile stress on the channel region 120. Alternatively, the first semiconductive material 116 may comprise other compound semiconductor materials, for example.

The first semiconductive material 116 is preferably epitaxially grown in some embodiments. The first semiconductive material 116 forms only on the exposed, recessed surfaces of the workpiece 102 in the epitaxial growth process. Alternatively, the first semiconductive material 116 may be deposited, using ALD, PVD, CVD, or other deposition methods, for example, and the first semiconductive material 116 may be patterned to remove the first semiconductive material 116 from over the isolation regions 104, the hard mask 110, the first sidewall spacers 112, and other undesired regions of the workpiece 102.

Figure 4:
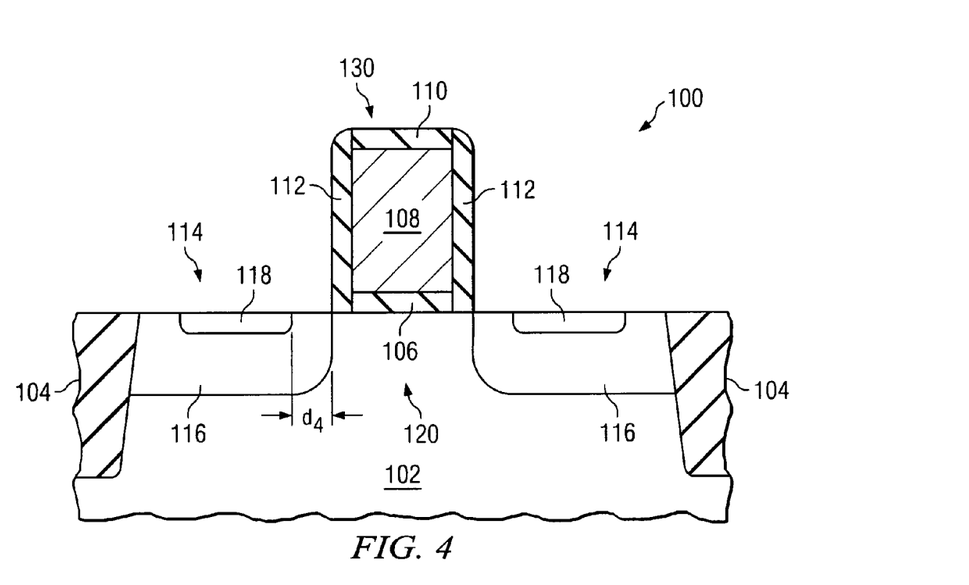

The first semiconductive material 116 is preferably formed to a height in a central region of the recesses 114 having a second dimension $d_2$ or $d_3$ as shown. In some embodiments, preferably the first semiconductive material 116 comprises a height at a central region of the first semiconductive material 116 such that the second dimension $d_2$ comprises about one-half or greater of the first dimension $d_1$. If the depth of the recesses 114, the first dimension $d_1$, comprises about 200 nm or less, as an example, then the second dimension $d_2$ comprising the height of the first semiconductive material 116 in a central region of the recesses 114 preferably comprises about 100 nm or greater in these embodiments. A second semiconductive material 118 may be formed in an upper half or greater of the recess 114 in these embodiments, for example, as shown in FIG. 4.

In some embodiments, the second dimension (represented by $d_3$ in FIG. 3, shown in phantom) more preferably comprises about three-quarters or greater of the first dimension $d_1$, as another example. If the depth of the recess 114, the first dimension $d_1$, comprises about 200 nm, as an example, the second dimension $d_3$ comprising the height of the first semiconductive material 116 in a central region of the recesses 114 preferably comprises about 150 nm or greater in these embodiments. The second semiconductive material 118 (see FIG. 4) may then be formed in an upper quarter or greater of the recess 114 in these embodiments, for example.

The first semiconductive material 116 preferably completely lines a sidewall of the recesses 114 at least on one side of the recesses 114, more preferably on the side of the recesses 114 proximate the channel region 120. The first semiconductive material 116 may completely line at least two sidewalls of the recesses 114 in some embodiments. For example, in FIG. 3, the first semiconductive material 116 is shown completely lining both sidewalls of the recesses 114 in a cross-sectional view. The first semiconductive material 116 may completely line all sidewalls of the recesses 114, in some embodiments (e.g., in the directions extending in and out of the paper, not shown). Preferably, a thickness represented by dimension $d_4$ in FIG. 3 of the first semiconductive material 116 on the sidewall of the recesses 114 proximate a top surface of the workpiece 102 near the channel region 120 comprises about 10 Angstroms or greater in some embodiments of the present invention, for example. Alternatively, the thickness $d_4$ of the first semiconductive material 116 proximate the channel region 120 may also comprise other dimensions. The thickness $d_4$ of the first semiconductive material 116 proximate the channel region 120 may depend on the size and shape of the recesses 114, for example.

As another example, the thickness of the first semiconductive material 116 may be substantially the same as the height $d_2$ of the first semiconductive material 116 in a central region of the recesses 114; e.g., the first semiconductive material 116 may be substantially conformal and may evenly line the sidewalls and bottom surface of the recesses 114, for example. In other words, the first semiconductive material 116 may comprise a first thickness (e.g., dimension $d_4$) on sidewalls of the recesses 114 and may comprise a second thickness (e.g., dimension $d_2$) on a bottom surface of the recesses 114, the second thickness being substantially the same as the first thickness.

In some embodiments, the recesses 114 in the workpiece 102 may be formed ex-situ. In these embodiments, the recesses 114 may first be completely filled with the first conductive material 116, and then a portion of the first conductive material 116 may be removed in an upper portion of the recesses 114. The recesses 114 may be completely filled with the first semiconductive material 116 using a deposition or epitaxial growth process. Then a top portion of the first semiconductive material 116 is removed from within the recess, e.g., using an etch process. The first semiconductive material 116 may be masked during the etch process so that selective portions, e.g., central regions, of the first semiconductive material 116 are etched away, for example. A masking material such as a hard mask and/or a photoresist (not shown) may be deposited over the workpiece 102, and the masking material may be patterned using lithography to expose a portion of the first semiconductive material 116. The masking material is used as a mask while the exposed top portion of the first semiconductive material 116 is etched away. Patterning the masking material to expose the portion of the first semiconductive material 116 preferably comprises leaving a portion of the first semiconductive material 116 adjacent to or proximate the gate 108 and gate dielectric 106 covered with the masking material, so a portion of the first semiconductive material 116 remains residing adjacent to the channel region 120, to be described further herein with respect to FIG. 5. In some embodiments, patterning the masking material to expose the portion of the first semiconductive material 116 preferably also comprises leaving a portion of the first semiconductive material 116 adjacent to or proximate the isolation regions 114, as well, as shown in FIGS. 3 and 4.

Referring next to FIG. 4, a second semiconductive material 118 is formed in an upper portion of the recesses 114, over the first semiconductive material 116 in the lower portion of the recesses 114. The second semiconductive material 118 is formed in an upper portion of the recesses 114 to fill the remainder of the recesses 114, as shown. The second semiconductive material 118 preferably comprises a different material than the first semiconductive material 116 and preferably completely fills the recesses 114. The second semiconductive material 118 is preferably epitaxially formed or grown in some embodiments, although alternatively, the second semiconductive material 118 may be deposited using similar methods described for the first semiconductive material 116. Note that if the second semiconductive material 118 and the first semiconductive material 116 are deposited rather than grown epitaxially, a lithography process may be required to remove these materials 118 and 116 from undesired regions of the workpiece 102.

The second semiconductive material 118 preferably comprises a material adapted to improve the subsequent formation of a silicide material at a top surface of the source and drain regions of the transistor 130. The second semiconductive material 118 preferably comprises Si, for example, although alternatively, other materials may also be used. The second semiconductive material 118 preferably comprises a thickness of about 100 nm or less, for example, although alternatively, the second semiconductive material 118 may comprise other dimensions depending on the depth of the recesses 114, for example. The second semiconductive material 118 preferably comprises a thickness of about 5 nm or greater in some embodiments, as another example. The second semiconductive material 118 preferably comprises a material that silicide will form better on than on the first semiconductive material 116, for example. The workpiece 102 may comprise the same material as the second semiconductive material 118, for example.

Preferably, the second semiconductive material 118 is formed such that a portion of the first semiconductive material 116 is disposed adjacent the workpiece 102 proximate an upper region of the workpiece 102, e.g., near the channel region 120, and optionally also near the isolation regions 104.

In some embodiments, the second semiconductive material 118 and the first semiconductive material 116 are preferably formed or grown epitaxially in-situ, without removing the workpiece 102 from a processing chamber. After the recesses 114 are formed in the workpiece 102, the workpiece 102 is placed in a processing chamber, and then gas sources are introduced into the processing chamber to epitaxially grow the first semiconductive material 116. A first gas source comprising Si (e.g., $SiH_4$ or $SiH_2Cl_2$) and a second gas source comprising Ge (e.g., $GeH_4$) and/or C (e.g., $CH_3Si$) may be introduced into the processing chamber, as examples, although alternatively, other gas sources may be used. Other gases may be included in the gas mixture, such as carrier gases and dopant source gases. An example of a carrier gas is HCl and an example of a p-type dopant source is $B_2H_6$, although alternatively, other gases may be used. If a dopant source gas is not included in the gas mixture, the source and drain regions may be doped later, after the recesses 114 are filled, for example.

The first and second gas sources are continued to be introduced until the desired amount or thickness of the first semiconductive material 116 has been formed. Then, without removing the workpiece 102 from the processing chamber, the first gas source is continued to be introduced into the processing chamber while the second gas source is discontinued from being introduced into the processing chamber, resulting in the in-situ epitaxial growth of the second semiconductive material 118 over the first semiconductive material 116.

The process for forming the second semiconductive material 118 is preferably well-controlled. For example, processing parameters such as process controls, temperature, pressure, flow rate and ratios, are preferably selected to achieve the specific shape of the first semiconductive material 116 and the second semiconductive material 118 desired. The processing parameters are preferably selected such that the second semiconductive material 118 preferably does not form on the top surface of the first semiconductive material 116, e.g., on the surface of the first semiconductive material 116 that is level with a top surface of the workpiece 102, as shown in FIG. 4. This results in some embodiments in the prevention of silicide (see silicide 124 in FIG. 5) on the top surface of the first semiconductive material 116 adjacent the channel region 120, and also adjacent the isolation regions 104, for example.

Advantageously, if an epitaxial process is used to form the first and second semiconductive materials 116 and 118, a lithography process to remove undesired first and second semiconductive materials 116 and 118 may be avoided, because the semiconductive material 116 only forms on the exposed portions of the workpiece 102 in the recesses 114, for example. Thus, the number of lithography steps and lithography mask sets required to manufacture the semiconductor device 100 may be reduced.

In some embodiments, the second semiconductive material 118 may be grown or deposited such that the recesses 114 are overfilled with the second semiconductive material 118 (not shown in the figures). The second semiconductive material 118 may be formed to slightly overfill the recesses 114 in the workpiece 102 above a top surface of the workpiece 102 by about 0 to 50 nm, for example. A portion of the second semiconductive material 118 may be consumed during a subsequent silicide process, so overfilling the recesses 114 may be advantageous in some applications, for example.

The manufacturing process for the semiconductor device 100 is then continued to complete the fabrication of the device 100. For example, in FIG. 5, a cross-sectional view of a portion of a completed semiconductor device 100 is shown. Second sidewall spacers 122 comprising similar materials and liners as described for the first sidewall spacers 112 are formed over the first sidewall spacers 112, using a similar method described for the first sidewall spacers 112. The first semiconductive material 116 and the second semiconductive material 118 in the recesses 114 on either side of the gate dielectric 106 and the gate 108 form the source region and the drain region of the transistor 130. Doped or implanted portions of the workpiece 102 proximate the first and second semiconductive materials 116 and 118 may also comprise a part of the source and drain regions, for example. A channel region 120 of the transistor 130 is located beneath the gate dielectric 106 between the source region and the drain region.

Figure 5:
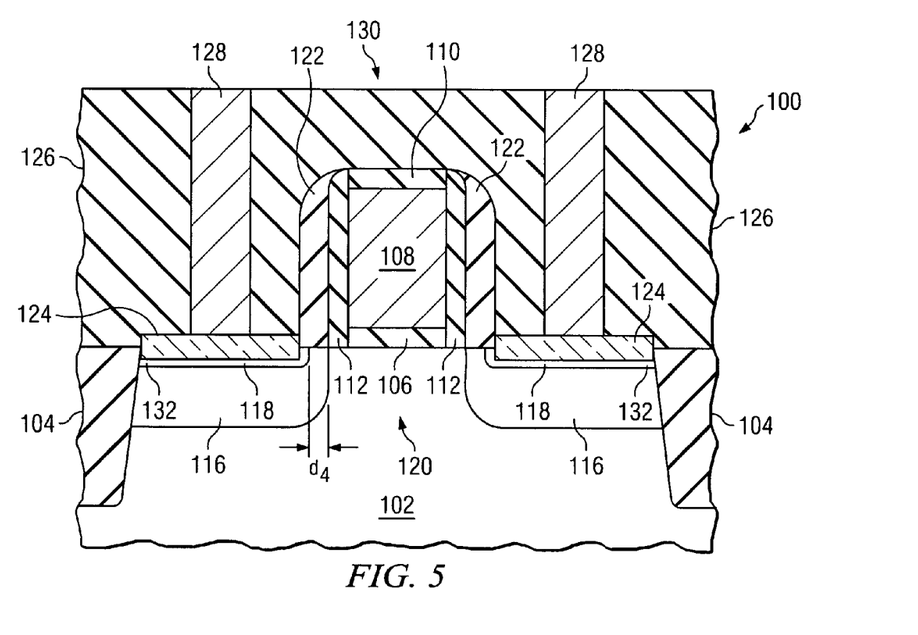
FIG. 5 shows a cross-sectional view of another preferred embodiment of the present invention, wherein the second semiconductive material extends completely to one edge region of the source and drain regions and a silicide is formed over the second semiconductive material.

A silicide region 124 is formed over the source and drain regions, e.g., over the second semiconductive material 118, as shown in FIG. 5. The silicide region 124 may be formed by depositing a silicidation metal over the source and drain regions 116/118, e.g., over all exposed surfaces of the structure, and then subjecting the workpiece 102 to an annealing process. The silicidation metal may comprise nickel, cobalt, copper, molybdenum, titanium, tantalum, tungsten, erbium, zirconium, platinum, or combinations thereof, as examples. After the metal is deposited over at least the source and drain region 116/118, the workpiece 102 is heated, causing the metal to diffuse into at least the second semiconductive material 118, and optionally in some embodiments, also the first semiconductive material 116, if portions of the first semiconductive material 116 is adjacent to the metal. A silicide region 124 comprising a silicide of the metal is formed over the second semiconductive material 118 and optionally also over portions of the first semiconductive material 116, for example. The hard mask 110 over the gate 108 may be removed so the gate 108 may also be silicided during the silicidation process, for example, not shown. After the silicide region 124 is formed, the layer of silicidation metal is then removed from the semiconductor device 100. The silicide regions 124 improve the conductivity and reduce the resistance of the source and drain regions 116/118 and optionally also the gate 108, for example. The silicide 124 may partially consume the underlying second semiconductive material 118, as shown, or the silicide 124 may completely consume the second semiconductive material 118, as shown in FIG. 7 at 218a/224a and 218b/224b.

Figure 7:
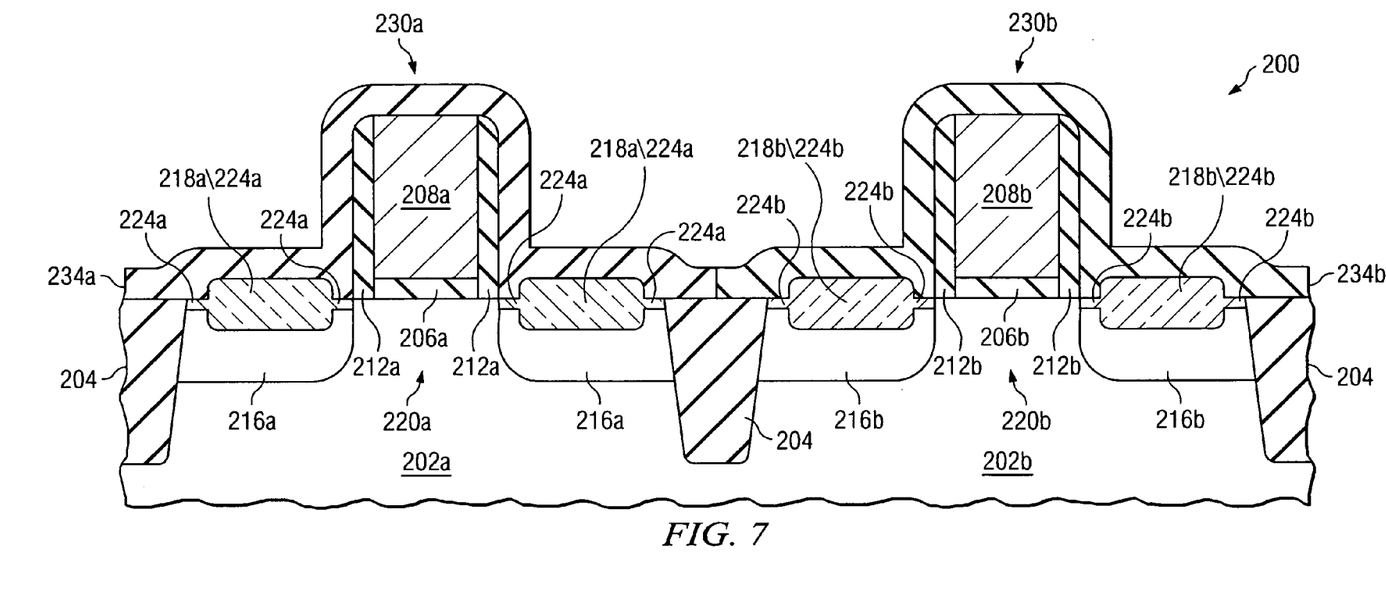
FIG. 7 is a cross-sectional view of embodiments of the present invention implemented in a complementary metal oxide semiconductor (CMOS) device.

An optional stress-inducing nitride layer which may also function as a contact etch stop layer may be formed over the transistor 130 at this point (not shown in FIG. 5; see FIG. 7 at 234a and 234b). An interlayer dielectric (ILD) layer 126 is then formed over the nitride layer. The ILD layer 126 preferably comprises an insulating material, and preferably comprises a material such as borophosphosilicate glass (BPSG), phosphosilicate glass (PSG), boron-doped silicon glass (BSG), organo-silicate glass (OSG), fluorinated silicate glass (FSG), spun-on-glass (SOG), silicon nitride, silicon dioxide, or plasma enhanced tetraethyloxysilane (PETEOS), as examples, although alternatively, the ILD layer 126 may comprise other materials.

The ILD layer 126 is etched to form contact holes using lithography, and source and drain contacts 128 are formed through the ILD layer 126 by depositing conductive material to fill the contact holes and make electrical contact to the silicided 124 source/drain regions 116/118. Note that the semiconductor device 100 also includes metallization layers (not shown) disposed above the ILD layer 126 and the source and drain contacts 128 that interconnect the various components of the semiconductor device 100. Other insulating materials and conductive materials may be formed over the transistor 130 and patterned to make electrical contact to portions of the transistor 130, for example, not shown. The semiconductor device 100 may be annealed to activate the dopants implanted during the various implantation steps, for example.

The semiconductor device 100 shown in FIG. 5 illustrates an embodiment of the present invention wherein the second semiconductive material 118 extends completely to the outer edge regions 132 of the source and drain regions 116/118, advantageously providing an increased amount of surface area for the silicide 124 formation proximate the isolation region 104. In this embodiment, the first semiconductive material 116 is formed using a deposition process. A lithography process is used to pattern the first semiconductive material 116, removing the first semiconductive material 116 from region 132 and leaving the first semiconductive material 116 proximate and adjacent to the channel region 120 lining the inner edge region of the recesses 114, as shown at dimension $d_4$, thereby allowing the formation of the second semiconductive material 118 proximate and adjacent to the channel region 120. However, in some embodiments, the second semiconductive material 118 does not extend completely across the edge region 132 so that a silicide 124 does not form adjacent the isolation region 104, for example, as shown in FIG. 7 (e.g., see silicide 218a/224a and 218b/224b).

Figure 6:
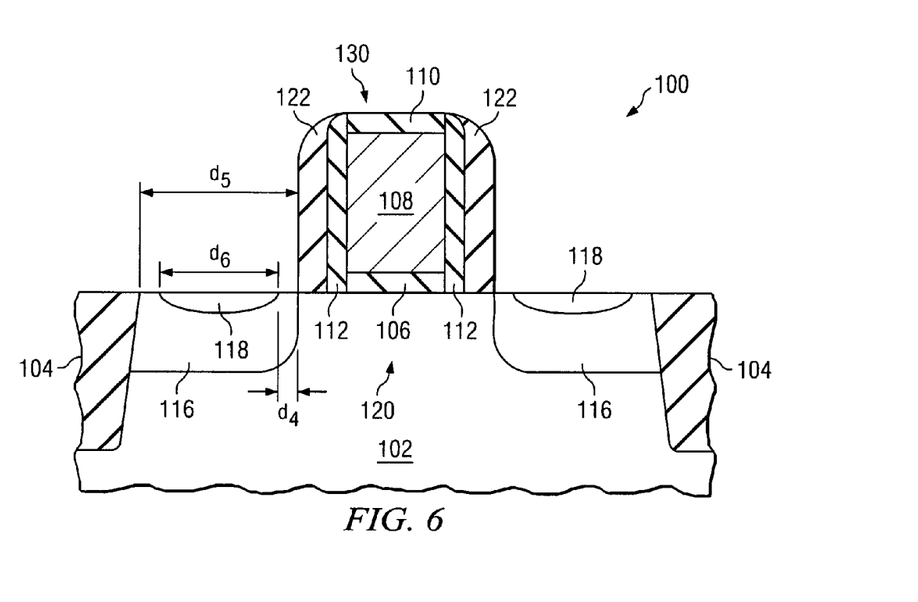
FIG. 6 shows a cross-sectional view of yet another preferred embodiment of the present invention, wherein the recesses are formed and filled after the formation of second sidewall spacers over the first sidewall spacers.

In the embodiments shown in FIGS. 1 through 4 and FIG. 5, the source and drain regions 116/118 are formed using an "early eSiGe" process, after the formation of first sidewall spacers 112. The first sidewall spacers 112 may comprise disposable spacers that are replaced later with permanent sidewall spacers 112, or the first sidewall spacers 112 may comprise permanent spacers that are left remaining in the structure, for example. Alternatively, embodiments of the present invention may be implemented in a "late eSiGe" process, after the formation of second sidewall spacers 122, as shown in FIG. 6. Some transistor 130 designs may require a wider channel region 120 or larger light or deep implantation regions proximate the source and drain regions 116/118, for example.

In this embodiment, first sidewall spacers 112 are formed over the sidewalls of the gate 108 and gate dielectric 106, and hard mask 110 if present, and the workpiece 102 may be doped using ion implantation and an optional anneal process, for example. Then second sidewall spacers 122 are formed over the sides of the first sidewall spacers 112. Then, the workpiece 102 is recessed as described for the embodiment of FIGS. 1 through 4, and the first and second semiconductive materials 116 and 118 are formed in the recesses 114, also previously described herein.

Note that in embodiment shown in FIGS. 1 through 4, the first semiconductive material 116 may be substantially conformal as deposited. The first semiconductive material may comprise a first thickness (such as dimension $d_4$ shown in FIG. 3) on sidewalls of the recesses and a second thickness (such as dimension $d_2$ shown in FIG. 3) on a bottom surface of the recesses, wherein the second thickness is substantially the same as the first thickness. In this embodiment, the second semiconductive material 118 comprises a lower surface having substantially the same shape (e.g., curvature or edges) of the recesses 114, although the size may be slightly smaller, e.g., having a smaller diameter.

In other embodiments, the first semiconductive material 116 may be thicker on the bottom surface than on sidewalls of the recesses 114 proximate the top surface of the workpiece 102, as shown in FIG. 6. This may be accomplished by varying the epitaxial growth processing parameters and conditions, for example, or by depositing the first conductive material 116 to completely fill the recesses 114 and then removing a portion of the first conductive material 116 using lithography, for example. In this embodiment, the second semiconductive material comprises a lower surface having a shallow bowl shape, as shown in FIG. 6. The second semiconductive material 118 has a greater thickness in a central region of the recesses and a lesser thickness in edge regions of the recesses, the edge regions being spaced apart from the workpiece at least on one side, and in some embodiments, on two sides or on all sides. Preferably, the width of the second semiconductive material 118 at a top surface of the workpiece 102, represented by dimension $d_6$ in FIG. 6, is preferably about 80% or greater of the dimension $d_5$ of the width of the recesses 114 in this embodiment, for example. More preferably, in some embodiments, the width of the second semiconductive material 118 at a top surface of the workpiece 102, dimension $d_6$, is preferably about 90% or greater of the dimension $d_5$ of the width of the recesses 114, for example.

Embodiments of the present invention may be implemented in PMOS transistors. In these embodiments, the first semiconductive material 116 preferably comprises SiGe or carbon-doped SiGe, which introduce or increase tensile stress of the source region and the drain region. Increasing the tensile stress of the source and drain regions 116/118 creates compressive stress on the channel region 120 and improves device performance.

Embodiments of the present invention may also be implemented in NMOS transistors. In these embodiments, the first semiconductive material 116 preferably comprises SiC, which introduces or increases compressive stress of the source region and the drain region. Increasing the compressive stress of the source and drain regions 116/118 creates tensile stress on the channel region 120 and improves device performance.

Embodiments of the present invention may also be implemented in a CMOS device, on either the PMOS FET or the NMOS FET of the CMOS device. Embodiments of the present invention may also be implemented in a CMOS device on both a PMOS FET 230a and an NMOS FET 230b, as shown in FIG. 7 in a cross-sectional view. Like numerals are used the various elements that were used to describe the elements in FIGS. 1 through 6. To avoid repetition, each reference number shown in FIG. 7 is not described again in detail herein. Rather, similar materials x02, x04, x06, x08, etc . . . are preferably used for the various material layers shown as were described for FIGS. 1 through 6, where x=1 in FIGS. 1 through 6 and x=2 in FIG. 7. As an example, the preferred and alternative materials and dimensions described for the first semiconductive material 116 and the second semiconductive material 118 in the description for FIGS. 1 through 6 are preferably also used for the first semiconductive materials 216a and 216b and the second semiconductive materials 218a and 218b shown in FIG. 7.

The PMOS FET 230a preferably comprises a first semiconductive material 216a comprising SiGe or carbon-doped SiGe, which increase tensile stress of the source and drain regions 216a/218a and increase compressive stress on the channel region 220a, which is surrounded on either side by and adjacent to the source and drain regions 216a/218a. The NMOS FET 230b preferably comprises a first semiconductive material 216b comprising SiC, which increases compressive stress of the source and drain regions 216b/218b and increases tensile stress on the channel region 220b. The second semiconductive materials 218a and 218b of both transistors 230a and 230b preferably comprise Si and are silicided by silicide region 224a and 224b, respectively. In this embodiment, during the silicide process, the silicide 224a and 224b completely consumes the second semiconductive materials 218a and 218b, as shown at 218a/224a and 218b/224b.

Note that portions of the first semiconductive materials 216a and 216b may also be covered by the silicide regions 224a and 224b, respectively. However, preferably, in some embodiments, the silicide 224a and 224b does not form over the first semiconductive material 216a and 216b, not shown. If the first semiconductive material 216a and 216b is silicided, preferably the silicide regions 224a and 224b do not extend above a top surface of the workpiece 102, as shown in FIG. 7.

Because the second semiconductive material 218a and 218b is more easily silicided than the first semiconductive material 216a and 216b, the silicide 224a and 224b is thicker over the second semiconductive material 218a and 218b (as shown at 218a/224a and 218b/224b) than over the first semiconductive material 216a and 216b, as shown at 224a and 224b over the first semiconductive material 216a and 216b, for example.

Advantageously, a portion of the first semiconductive material 216a and 216b is adjacent to and abuts the channel regions 220a and 220b of the transistors 230a and 230b, respectively, providing increased stress of the desired type (tensile or compressive, respectively), close to the channel regions 220a and 220b and enhances the device 200 performance.

Note also that in this embodiment, stress liners 234a and 234b have been formed over the PMOS transistor 230a and the NMOS transistor 230b to further create stress on the transistors 230a and 230b, respectively. The stress liners 234a and 234b preferably create different types of stress on the transistors 230a and 230b, for example. Liner 234a preferably contains compressive stress and liner 234b preferably contains tensile stress, for example. The various types of stress may be created in a nitride material such as silicon nitride by changing the deposition temperature and various processing conditions, for example.

To manufacture the CMOS device 200, the NMOS transistor 230b region may be covered with a masking material (not shown) while the PMOS transistor 230a region is processed in accordance with embodiments of the present invention. Likewise, the PMOS transistor 230a region may be covered with a masking material while the NMOS transistor 230b region is processed (not shown). The masking material may comprise a disposable spacer comprising a nitride material, for example, although other materials may also be used.

Note that only one PMOS transistor 230a or one NMOS transistor 230b of the CMOS device 200 may comprise the novel source and drain regions 216a/218a or 216b/218b of embodiments of the present invention described herein (not shown).

Embodiments of the present invention may be implemented in applications where transistors are used, as described herein and shown in the figures. One example of a memory device that embodiments of the present invention may be implemented in that uses both PMOS FET's and NMOS FET's is a static random access memory (SRAM)

device. A typical SRAM device includes arrays of thousands of SRAM cells, for example. Each SRAM cell may have four or six transistors (for example). A commonly used SRAM cell is a six-transistor (6T) SRAM cell, which has two PMOS FET's interconnected with four NMOS FET's. The novel methods and structures that introduce strain to the channel regions of transistors described herein may be implemented in the transistors of SRAM devices and other memory devices, for example.

Embodiments of the present invention may also be implemented in semiconductor device structures other than the transistors 130, 230a, and 230b shown in the drawings. For example, recesses 114 may be formed in a workpiece 102 and the first and second semiconductive materials 116 and 118 may be used to fill the recesses 114 as described herein, in order to alter the stress of an adjacent region within the workpiece 102 in other semiconductor device applications.

Embodiments of the present invention include semiconductor devices 100 and 200 and transistors 130, 230a, and 230b including the first semiconductive materials 116, 216a, and 216b and second semiconductive materials 118, 218a, and 218b filling the recesses 114, 214a, and 214b as described herein. Embodiments of the present invention also include methods of fabricating the semiconductor devices 100 and 200 and transistors 130, 230a, and 230b, for example.

Advantages of embodiments of the invention include providing novel structures and methods for altering the stress of channel regions of transistors, by altering the stress of source and drain regions of transistors. A portion of the first semiconductive material 116, 216a, and 216b is left remaining adjacent the channel regions 120, 220a, and 220b, so that the beneficial effects of the compound semiconductor material of the first semiconductive material 116, 216a, and 216b is realized in the transistor 130, 230a, and 230b performance. The second semiconductive material 118, 218a, and 218b improves the formation of the silicide regions 124, 224a, and 224b (e.g., regions 218a/224a and 218b/224b), ensuring a better contact of the silicide material with the second semiconductive material 118, 218a, and 218b, reducing sheet resistance and improving conductivity, which also improves the transistor 130, 230a, and 230b and device 100 and 200 performance.

The selectively-formed second semiconductive material 118a, 218a, and 218b provides a localized structure that advantageously minimizes the formation of silicide 124, 224a, and 224b near the channel region 120, 220a, and 220b and also near the isolation regions 204 in some embodiments.

Embodiments of the present invention are easily implementable in existing manufacturing process flows, with a small or reduced number of additional processing steps being required, particularly if the first and second semiconductive materials 116 and 118 are formed using an in-situ epitaxial growth process, for example.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A transistor, comprising:
   a workpiece;
   a channel region formed within the workpiece;
   a gate dielectric disposed over the channel region;
   a gate disposed over the gate dielectric;
   a source region disposed within the workpiece proximate a first side of the channel region;
   a drain region disposed within the workpiece proximate a second side of the channel region, the source region and the drain region comprising a first semiconductive material in a lower portion and in an upper portion at least adjacent to the channel region, the source region and the drain region further comprising a second semiconductive material disposed over the first semiconductive material in the lower portion, the second semiconductive material being different than the first semiconductive material, the first semiconductive material comprising a first thickness in a central region, the second semiconductive material comprising a second thickness, wherein the first thickness is equal to or greater than the second thickness; and
   a silicide disposed over and contacting the first and the second semiconductive material.

2. The transistor according to claim 1, wherein the source region and the drain region comprise a first width, wherein the second semiconductive material comprises a top surface having a second width, the second width being about 80% or greater of the first width.

3. The transistor according to claim 1, further comprising a suicide disposed over and adjacent to the gate.

4. The transistor according to claim 1, wherein the transistor comprises a p channel metal oxide semiconductor (PMOS) field effect transistor (FET), and wherein the first semiconductive material increases a tensile stress of the source region and the drain region.

5. The transistor according to claim 1, wherein the transistor comprises an n channel metal oxide semiconductor (NMOS) field effect transistor (FET), and wherein the first semiconductive material increases a compressive stress of the source region and the drain region.

6. A complementary metal oxide semiconductor (CMOS) device including the transistor of claim 1.

7. A transistor, comprising:
   an active region disposed within a semiconductor substrate between first and second isolation regions;
   a first source/drain region disposed adjacent the first isolation region and within the active region;
   a second source/drain region disposed adjacent the second isolation region and within the active region;
   a channel region disposed within the active region, wherein channel region is disposed between the first and the second source/drain regions;
   a first semiconductor layer disposed in the first source/drain region, the first semiconductor layer being formed in a lower portion of the first source/drain region, and in a first upper portion of the first source/drain region adjacent the first isolation region and in a second upper portion of the first source/drain region adjacent the channel region;

a second semiconductor layer disposed in a third upper portion of the first source/drain region, the third upper portion being disposed between the first and the second upper portions, the second semiconductor layer having sidewalls, a bottom surface and a top surface, wherein the second semiconductor layer contacts the first semiconductor layer on the sidewalls and the bottom surface, wherein the second semiconductor layer is different than the first semiconductor layer; and a silicide disposed on a top surface of first semiconductor layer and the top surface of the second semiconductor layer.

8. The device of claim 7, wherein a thickness of the silicide on the first semiconductor layer is smaller than a thickness of the silicide on the second semiconductor layer.

9. The device of claim 7, wherein the sidewalls and the bottom surface of the second semiconductor layer are bowl shaped.

* * * * *